United States Patent Office 3,677,920

Patented July 18, 1972

3,677,920

PHOTOPOLYMERIZABLE DIISOCYANATE MODIFIED UNSATURATED POLYESTER CONTAINING ACRYLIC MONOMERS

Tsunetoshi Kai and Takeaki Hagihara, Asaka-shi, Saitama-ken, and Teruhisa Ishido, Tokyo, Japan, assignors to Asahi Kasei Kogyo Kabushiki Kaisha, Osaka, Japan No Drawing. Filed June 23, 1969, Ser. No. 835,726

Claims priority, application Japan, July 6, 1968, 43/46,991

Int. Cl. C08d *1/10;* C08f *1/10*

U.S. Cl. 204—159.15 14 Claims

ABSTRACT OF THE DISCLOSURE

A photopolymerizable composition comprising:

(I) A diisocyanate modified unsaturated polyester prepared by reacting a diisocyanate with an unsaturated polyester at a mol ratio of 1:2 to 1:1, said unsaturated polyester having terminal groups selected from carboxyl and hydroxy groups, having an average molecular weight of about 2,000 to 50,000, and containing about $1\times10^{-4}$ to $2\times10^{-3}$ mole of ethylenic unsaturation per gram of the unsaturated polyester, (II) About 10 to 80 weight percent, based upon the total weight of the composition, of at least one ethylenically unsaturated monomer, different from the unsaturated polyester, which is addition-copolymerizable with the diisocyanate modified unsaturated polyester (I); and (III) About 0.001 to 10 weight percent, based upon the total weight of the composition, of a photopolymerization initiator. This photopolymerizable composition is especially effective for the production of a variety of laminated articles and flexographic printing plates among a variety of image-making articles.

This invention relates to novel compositions which are photopolymerizable by the action of actinic light and which are particularly useful in the production of laminated articles such as laminated safety glass and other multilayer articles and image-making articles such as flexographic printing plates.

Heretofore, there are known photopolymerizable compositions mainly comprising an unsaturated polyester, an ethylenically unsaturated polyester and an addition polymerization initiator activable by actinic light.

It is also known that photopolymerized articles having any degree of hardness may be obtained by varying the number of ether-bond in the alcoholic component, the concentration of ethylenic double bond or the molecular weight of one ester-bond to another ester-bond of unsaturated polyesters in the photopolymerizable compositions. According to this known method, the soft, photopolymerized articles obtained by increasing the number of ether-bond in the alcoholic component of unsaturated polyesters are not so high in mechanical strength. Also the soft, photopolymerized articles may be obtained by decreasing the concentration of ethylenic double bond but the apparent photocrosslinking reaction is extremely retarded and the mechanical strength after photopolymerization are low and, for example, unsuitable for an interlayer of laminated safety glass and a uexographic printing plate. Further, it is very difficult to obtain unsaturated polyesters having a high molecular weight due to gellation, discoloration and thermal decomposition which occur in the course of the condensation reaction at high temperatures. Accordingly, a photopolymerizable composition mainly comprising an unsaturated polyester after photopolymerization cannot have sufficient softness and high tensile strength and high tensile elongation at the same time. Therefore, when the photopolymerized article is provided with sufficient softness, the tensile strength becomes low. On the other hand with high tensile strength, the softness decreases.

It is an object of this invention to provide a novel photopolymerizable composition which gives a photopolymerized product having sufficient softness, superior tensile strength and elongation and which is especially useful in the production of laminated articles, particularly laminated safety glass and image-making articles, particularly flexographic printing plates.

Other and additional object of this invention will become apparent from a consideration of this entire specification.

In accord with and fulfilling these objects, there is provided a photopolymerizable composition comprising:

(I) A diisocyanate modified unsaturated polyester prepared by reacting a diisocyanate with an unsaturated polyester at a mole ratio of 1:2 to 1:1, said unsaturated polyester having terminal groups selected from carboxyl and hydroxy groups, having an average molecular weight of about 2,000 to 50,000, and containing about $1\times10^{-4}$ to $2\times10^{-3}$ mole of ethylenic unsaturation per gram of the unsaturated polyester polymer, (II) About 10 to 80 weight percent, based upon the total weight of the composition, of at least one ethylenically unsaturated monomer, different from the unsaturated polyester polymer, which is addition-copolymerizable with the diisocyanate modified unsaturated polyester polymer (I); and (III) About 0.001 to 10 weight percent, based upon the total weight of the composition, of a photopolymerization initiator.

According to the present invention a diisocyanate is used as a jumping agent in the production of high molecular polymers of the unsaturated polyesters. Thus obtained diisocyanate modified unsaturated polyesters are macro-block copolymers having a high molecular weight and the characteristics of unsaturated polyesters.

The photopolymerizable compositions mainly comprising a diisocyanate modified unsaturated polyester simultaneously provide low Young's modulus, high tensile strength and high tensile elongation to the photopolymerized articles. According to the prior art photopolymerizable composition, when Young's modulus is lowered tensile strength and elongation decrease. On the other hand according to the present photopolymerizable composition, when an unsaturated polyester is modified with a diisocyanate, it is possible to increase tensile strength and elongation even if Young's modulus is lowered. In spite of low Young's modulus of the photopolymerized articles by lowering the concentration of ethylenic double bond or by employing a soft ethylenically unsaturated monomer the photopolymerizable compositions of this invention simultaneously provide sufficient softness, high tensile strength and elongation.

The unsaturated polyesters can be produced by conventional processes. Usually an unsaturated polyester is formed by direct esterification, ester exchange or addition reaction between (a) polyols and (b) an unsaturated dicarboxylic acid and/or its anhydride and or dimethyl or diethyl ester thereof, and if desired, modifying agents such as saturated mono-, di-, or poly-carboxylic acid, unsaturated monocarboxylic acid anhydrides or methyl or ethyl esters thereof.

The polyols which can be used in the present invention are classified into two groups.

One group of the polyols gives a segment having a molecular weight of one polar bond to another polar bond below 80 in an unsaturated polyester. Such includes preferably ethylene glycol, dioxyethylene glycol, propylene glycol, trimethylene glycol, tetramethylene glycol and pentamethylene glycol.

The other group gives a segment having a molecular weight of one polar bond to another polar bond of 80 to 5,000 in an unsaturated polyester. This group includes preferably alkyleneglycols of the formula $$HO—(CH_2)_n—OH$$

wherein $n$ is an integer of 6 to 10, polyoxyethyleneglycols of the formula, $HO—(CH_2—CH_2—O)_m—H$ wherein $m$ is an integer of 3 to 110, polyoxypropyleneglycols of the formula, $$HO—(CH_2—\underset{CH_3}{\underset{|}{CH}}—O)_p—H$$

wherein $p$ is an integer of 2 to 86, copolymers of ethylene oxide with propylene oxide having an average molecular weight of 200 to 5,000, polyoxytrimethyleneglycols of the formula $HO—(CH_2—CH_2—CH_2—O)_q—H$ wherein $q$ is an integer of 2 to 86, polyoxytetramethyleneglycols of the formula, $$HO—(CH_2—CH_2—CH_2—CH_2—O)_r—H$$

wherein $r$ is an integer of 2 to 65, glycerinpropylethertriol monolaurate, glycerinpolyoxypropylethertriols of the formula, $$\begin{array}{l} CH_2—O—(CH_2—\underset{CH_3}{\underset{|}{CH}}—O)_S—H \\ | \\ CH—O—(CH_2—\underset{CH_3}{\underset{|}{CH}}—O)_{S'}—H \\ | \\ CH_2—O—(CH_2—\underset{CH_3}{\underset{|}{CH}}—O)_{S''}—H \end{array}$$

wherein S, S' and S" represent an integer of 1 to 50 and monomethyl, -ethyl or -propyl ethers thereof, trimethylolpropane-propylethertriol monooleate, hydroxyl-terminated polystyrenes having an average molecular weight of 100 to 5,000, hydroxyl-terminated polybutadienes having an average molecular weight of 100 to 5,000, hydroxyl-terminated polyethylenes having an average molecular weight of 100 to 5,000 and hydroxyl-terminated polypropylenes having an average molecular weight of 100 to 5,000.

Exemplary unsaturated dicarboxylic acids, anhydrides and methyl or ethyl esters thereof utilized for the preparation of an unsaturated polyester include maleic acid, fumaric acid, citraconic acid, mesaconic acid, itaconic acid, glutaconic acid, muconic acid, aconitic acid and dimethyl or diethyl esters thereof, maleic anhydride, citraconic anhydride, itaconic anhydride and chloromaleic acid.

Examples of suitable saturated mono-, di- or poly-carboxylic acids, anhydrides, methyl or ethyl esters thereof and unsaturated monocarboxylic acid which can be used for modifying an unsaturated polyester include succinic acid, glutaric acid, adipic acid, pimelic acid, phthalic acid, acid, isophthalic acid, terephthalic acid, dimethylesters, diethylesters thereof, phthalic anhydride, palmitic acid, stearic acid, oleic acid, linolic and linolenic acid.

Also the unsaturated polyesters may be produced in the same way as mentioned above using an amide dicarboxylic acid or an amide glycol as one component. The amide dicarboxylic acids may be produced by reacting a saturated dicarboxylic acid, the ester or anhydride thereof with a primary diamine at a mole ratio of at least one. The amide glycols may be produced by reacting a saturated dicarboxylic, the ester or anhydride thereof with an aminoalcohol at a mole ratio of at least one. These reactions may be carried out at a temperature of 120° C. to 250° C. for 0.5 to 4 hours under a nitrogen atmosphere.

Examples of suitable saturated dicarboxylic acids, anhydrides and methyl or ethyl esters thereof include succinic acid, glutaric acid, adipic acid, pimelic acid, phthalic acid, terephthalic acid, dimethylesters, diethylesters thereof and phthalic anhydride.

The aminoalcohols are preferably monoethanolamine, 3 - aminopropanol, 4 - aminobutanol, 6 - aminohexanol, 2-aminopropanol, N-methylethanolamine and 10-aminodecanol.

Exemplary primary diamines include ethylenediamine, tetramethylenediamine, hexamethylenediamine, bisaminoethylether, bisaminopropylether, alphamethylhexamethylenediamine, diethylenetriamine and triethylenetetramine.

The diisocyanates to be reacted with the unsaturated polyesters include 2,4-tolylene diisocyanate,
2,6-tolylene diisocyanate,
phenylene diisocyanate,
3,3'-bitolylenemethane-4,4'-disocyanate,
methaphenylene diisocyanate,
4,4'-biphenylene diisocyanate,
4,4'-biphenylenemethane diisocyanate,
xylene diisocyanates,
1,4-naphthylene diisocyanate,
1,5-naphthylene diisocyanate,
1,4-tetramethylene diisocyanate,
1,6-hexamethylene diisocyanate,
1,10-decamethylene diisocyanate,
ω,ω'-diisocyanate dimethylbenzol,
ω,ω'-dipropylether diisocyanate,
octadecyl diisocyanate,
1,4-cyclohexylene diisocyanate,
4,4'-methylene-bis-(cyclohexyl isocyanate),
1,5-tetrahydronaphthylene diisocyanate and tolylenediisocyanate dimers.

The unsaturated polyester and the diisocyanate may be reacted at a mole ratio of 1:2 to 1:1. For example, this reaction is carried out at a temperature of about 50° C. to 150° C. for about 60 to 300 minutes in a nitrogen atmosphere in the presence or absence of a catalyst. The catalysts include tertiary amines such as diethylcyclohexylamine and triethylenediamine, and organo-heavy-metal compounds soluble in the reaction system such as ferrous acetoacetate, dibutyltin dilaurate, stannous oleate and stannous octate. The reaction may be carried out in the absence of a catalyst in case of using the unsaturated polyesters having a high molecular weight. Furthermore, in modifying the unsaturated polyester with the diisocyanate, at most one mole, based on two moles of said diisocyanate, of a polyol is employed. The same polyols as afore-mentioned which give a segment having a molecular weight of one polar group to another polar group of 80 to 5,000 in the unsaturated polyester may be employed for this purpose.

In order to provide good solvent resistance, abrasion resistance, scratch resistance, weather resistance, impact resistance and transparency as well as sufficient softness, high tensile strength and high tensile elongation to the photopolymerized article, it is preferable to employ an unsaturated polyester having an average molecular weight of about 2,000 to 50,000 in order to restrict the concentration of NHCOO or NHCO group in the diisocyanate modified unsaturated polyester. With an average molecular weight below 2,000, the concentration of NHCOO or NHCO group in the diisocyanate modified unsaturated polyester is too high and consequently the photopolymerized article becomes hard due to molecular cohesion of NHCOO or NHCO group and the impact resistance and weather resistance of the photopolymerized article deteriorate and easily discolor due to an interaction between ethylenic unsaturation and NHCOO or NHCO group. On the other hand with the average molecular weight abbve 50,000, a viscosity of the diisocyanate modified unsaturated polyester is too high and the workability of the photopolymerizable composition is remarkably poor and such is unfit for practical purposes. The diisocyanate and the unsaturated polyester are preferably reacted at a mole ratio of 1:2 to 1:1. When the mole of the diisocyanate is greater than that of the unsaturated polyester, the isocyanate groups remaining in the diisocyanate modified unsaturated polyester deteriorate weather resistance and cause discoloration or gellation in preparing the photopolymerizable compositions. In general polyurethane elastomers, NHCOO or NHCO groups are employed as hard segments which acts as crystalline portions and as nodes between amorphous soft segments. However, in the present invention a diisocyanate is employed merely as a jumping agent in the production of high molecule polymers of the unsaturated polyesters. Low weathering and discoloring caused by NHCOO or NHCO groups are prevented to the utmost and high tensile strength, high tensile elongation and low Young's modulus are provided by photocrosslinking copolymerization reaction between the ethylenic double bonds in the diisocyanate modified unsaturated polyester and an ethylenically unsaturated monomer.

In order to improve the tensile strength, tensile elongation, softness, solvent resistance, abrasion resistance, impact resistance and flexibility of the photopolymerized articles, a part of the unsaturated dicarboxylic acids, anhydrides or methyl or ethyl esters utilized for the preparation of such unsaturated polyester may be replaced by a saturated carboxylic acid, anhydride or methyl or ethyl ester thereof to vary the ethylenic double bond concentration in the unsaturated polyester. The term "double bond concentration" means the mole number of ethylenic double bonds per 1 g. of the unsaturated polyester polymer. The ethylenic double bond concentration of an unsaturated polyester is preferably in the range of $1\times10^{-4}$ mole/gram to $2\times10^{-3}$ mole/gram. With said ethylenic double bond concentrations above $2\times10^{-3}$ mole/gram, the softness becomes so poor that the photopolymerized articles after photopolymerization of the photopolymerizable compositions mainly comprising a diisocyanate modified unsaturated polyester exhibit substantially neither high tensile elongation nor impact resistance. On the other hand with ethylenic double bond concentration below $1\times10^{-4}$ mole/gram, the photopolymerization only proceeds to such an extent as to give a photopolymerized article having a poor tensile strength which is of no use for practical purposes.

For photomolding purposes, with ethylenic double bond concentrations above $2\times10^{-3}$ mole/gram, the photopolymerized articles tend to become so hard and so low in tensile elongation that for example, the laminated articles exhibit a remarkably low penetration resistance and absorbability of thermal expansion. On the other hand when the ethylenic double bond concentration is below $1\times10^{-4}$ mole/gram, the photopolymerizable compositions do not give sufficiently cross-linked, net-work polymers after polymerization and the tensile strength of such interlayer becomes low. When the ethylenic double bond concentration is in the range of $1\times10^{-4}$ mole/gram to $2\times10^{-3}$ mole-gram, the photopolymerizable compositions give adequately cross-linked, net-work, infusible, heat-resistance polymers after photopolymerization and the tensile strength, elasticity and softness are greatly improved. Also the temperature dependency of such an article becomes very small.

In order to provide sufficient softness and tensile elongation to the photopolymerized article, the unsaturated polyester preferably contains in the molecule non-polar or weak polar segments such as alkylene or oxyalkylene groups.

The softness and tensile elongation of the photopolymerized articles is also related to the concentration of polar groups in the unsaturated polyester. It has been found that if the polar bond to polar bond segment concentration is the unsaturated polyester having an average molecular weight of about 80 to 5,000 is at least one percent by weight, satisfactory photopolymerized articles are obtained. The term "a polar bond" represent an ester bond or an amide bond.

The photopolymerized articles according to the photopolymerizable compositions of this invention have softness, high tensile elongation and completely absorb a thermal expansion of adherents and an impact when used as interlayers. The term "a molecular weight of one polar bond to another polar bond" represents a molecular weight of a segment from one polar bond to the next successive polar bond. For example, the segment content of an unsaturated polyester is given by the following formula:

Content (percent by weight)

$$=\frac{\sum_{i=1}^{i} ME_i n_i}{\sum_{i=1}^{i} ME_i n_i+\sum_{j=1}^{j} mE_j m_j+44\left(\sum_{i=1}^{i} n_i+\sum_{j=1}^{j} m_j\right)}$$

$ME_i$: Molecular weight of $i$ kinds of segments of one ester-bond to another ester-bond of 80 up to 5,000 in the molecule of an unsaturated polyester.

$n_i$: Mole number of $ME_i$ $mE_j$: Molecular weight of $j$ kinds of segments of one polar bond to another polar bond below 80 in the molecule of an unsaturated polyester and above 5,000 in the molecule of an unsaturated polyester.

$n_j$: Mole number of $mE_j$.

As the second component of the photopolymerizable compositions of this invention exemplary ethylenically unsaturated monomers include:

(A) Compounds of one of the three following general formulae:

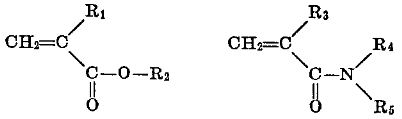

and

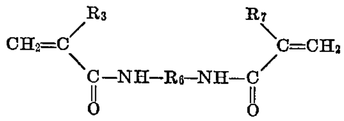

wherein $R_1$ represents a hydrogen atom, chlorine atom or methyl group; $R_2$ represents hydrogen atom; $R_3$ and $R_7$ represents independently hydrogen atoms or methyl groups; $R_4$ represents a hydrogen atom, methyl or ethyl group; $R_5$ represents a hydrogen atom, a $—C_mH_{2m+1}$ group wherein $m$ is an integer of 1 to 6, a cyclohexyl group, a $—(CH_2)_n—OH$ group, wherein $n$ is an integer of 1 to 5, a $—(CH_2)_p—O—C_qH_{2q+1}$ group, wherein $p$ is an integer of 1 to 2 and $q$ is an integer of 1 to 5 or a $—CH_2—CH{=}CH_2$ group; and $R_6$ represents a $—(CH_2)_r—$ group, wherein $r$ is an integer of 1 to 10;

(B) Compounds of one of the following two general formulae:

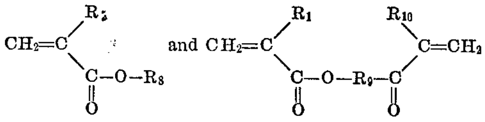

wherein $R_1$ and $R_{10}$ each represent a hydrogen atom, chlorine atom or methyl group; $R_8$ represents a $—C_sH_{2s+1}$ group, wherein $s$ is an integer of 1 to 15, a

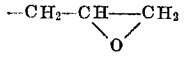

group, a

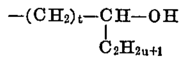

group wherein $t$ is an integer of 1 to 2 and $u$ is an integer of 1 to 5, a

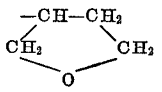

group, a $—CH_2—CH=CH_2$ group, or a $$—(CH_2—CH_2—O)_v—H$$

group wherein $v$ is an integer of 1 to 15; $R_9$ represents a $—(CH_2—CH_2—O)_w—$ group wherein $w$ is an integer of 1 to 15;

(C) Aromatic compound having at least one $$CH_2=C\langle$$

group and one benzene nucleus; and (D) Other ethylenically unsaturated compounds.

Examples of suitable compounds (A) include acrylic acid, alpha-chloroacrylic acid, methacrylic acid, acrylamide, methacrylamide, N,N-dimethylacrylamide, N-isopropylacrylamide, N-hexyacrylamide, N-cyclohexylacrylamide, N-methylolacrylamide, N-ethylolacrylamide, N-amylolacrylamide, N-allyalacrylamide, N,N'-methylene bisacrylamide, N,N'-trimethylenebisacrylamide, N,N'-hexamethylenebisacrylamide, N,N' - decamethylenebisacrylamide, N-methoxyethylacrylamide, N-methylmethacrylamide, N-allylmethacrylamide, N-methylolmethacrylamide, N,N'-methylenebismethacrylamide and N-ethoxyethylmethacrylamide. Especially acrylic acid is preferred in this group.

Examples of suitable compounds (B) include methyl acrylate ethyl acrylate, n-butyl acrylate, isobutyl acrylate, n-propyl acrylate, isopropyl acrylate, 2-ethylhexyl acrylate, n-octyl acrylate, n-decyl acrylate, n-tetradecyl acrylate, allyl acrylate, furfuryl acrylate, glycidyl acrylate, methyl methacrylate n-butyl methacrylate, isobutyl methacrylate, 2-ethylhexyl methacrylate, lauryl methacrylate, furfuryl methacrylate, diethyleneglycol diacrylate, tetraethyleneglycol diacrylate, ethyleneglycol monomethacrylate, diethyleneglycol monoacrylate, hexamethyleneglycol dimethacrylate, tetradecylethyleneglycol dimethacrylate, 2-hydroxyethyl methacrylate, 2-hydroxypropyl methacrylate, 2-hydroxyhexyl methacrylate, and glycidylmethacrylate.

Examples of suitable other ethylenically unsaturated divinylbenzene, alpha-methylstyrene, vinyltoluene, alpha-chlorostyrene, vinylchlorobenzene, vinylphenol, aminostyrene, vinylbenzoic acid, methoxystyrene, allylbenzene, diallylbenzene, allyltoluene, monoallylphthalate and diallylphthalate.

Examples of suitable other ethyenically unsaturated compounds (D) include 1,3-butadiene, 2-chlorobutadiene, 2-methylbutadiene, allylalcohol, allylacetate, vinylacetate, vinylpropionate, maleic acid, fumaric acid, itaconic acid, dimethyl maleate, diethyl maleate, dimethyl fumarate, diethyl fumarate, dimethyl itaconate, diethyl itaconate, cinnamic acid, maleic anhydride, itaconic anhydride, ethylvinylether, propylvinylether, methylvinylketone, acrolein, vinylidene chloride, vinylpyridine, vinylpyrrolidone, diethylvinylamine, vinylcarbazole and triallylcyanurate.

In order to improve the mechanical strength of the photopolymerized articles, it is preferred to employ at least one of said compounds (A) in an amount of at least 5 percent of the total weight of the ethylenically unsaturated monomers. When the amount is less than 5 percent, such does not significantly change the mechanical strength of the polymer after photopolymerization.

In order to improve the elongation of the photopolymerized articles, it is preferred to employ at least one of said compounds (B) in an amount of at least 5 percent of the total weight of the monomers. When the amount of compounds (B) is less than 5 percent, the elongation of the polymer after photopolymerization does not increase.

Further, in order to improve the transparency of the photopolymerized articles, it is preferred to employ at least one of said aromatic compounds (C) in an amount of at least 1 percent of the total amount of the ethylenically unsaturated monomers. When the amount of compounds (C) is less than 1 percent, the transparency of the polymer after photopolymerization does not increase.

Still further, in order to improve the properties of the photopolymerized articles, the mixture of ethylenically unsaturated monomers may comprise any two or three of said compounds (A), said compound (B) and said aromatic compounds (C). When a mixture of two different types of monomers is used, i.e. (A)(B):(A)(C); or (B)(C) it is preferred to use (B) or (C) in amounts of at most 90 percent of the total weight of the monomer mixture. When a mixture of three types of monomers is used, it is preferred to employ the third compounds (C) in amounts of at most 80 percent of the total amount of the monomer mixture.

Still more further, in order to control a viscosity of photopolymerizable compositions mainly comprising a diisocyanate modified unsaturated polyester from a view point of workability and to improve the weather resistance of the photopolymerized articles, it is preferred to employ at least one unsaturated polyester in an amount of at most 60 percent of the weight of the diisocyanate modified polyester or polyesteramide. The same unsaturated polyesters as aforementioned may be employed for this purpose.

The diisocyanate modified unsaturated polyesters according to the present invention can be photopolymerized with the aforesaid ethylenically unsaturated compound with the use of a known photopolymerization initiator.

Examples of suitable such known photopolymerization initiators include benzoins such as benzoin, alpha-methylbenzoin, benzoin methyl ether, benzoin ethyl ether, alpha-phenylbenzoin, alpha-allylbenzoin; phenones such as acetophenone, benzophenone; anthraquinones such as anthraquinone, chloroanthraquinone, methylanthraquinone, tert-butylanthraquinone; disulphides such as diphenyl disulphide, tetraethylthiuram disulphide; diketones such as benzil, diacetyl; aranyl salts such as uranyl nitrate, uranyl propionate; 2-naphthalene sulfonyl chloride; metal halides such as silver chloride, silver bromide, stannic chloride, stannous chloride and titanium chloride.

These photopolymerization initiators are preferably used in an amount of from 0.001 to 10 percent by weight based upon the total weight of the photopolymerizable composition. When the amount of the photopolymerization initiator is less than 0.001 percent by weight, the photopolymerization reaction is greatly retarded and is too slow for practical commercial purposes. On the other hand, amounts of initiator of more than 10 percent by weight do not significantly increase the reaction and would be uneconomical.

Known thermal polymerization inhibitors may be employed for the purpose of maintaining storage stability (shelf life) of the photopolymerizable compositions. Such stabilizers may be added when the components of a photopolymerizable composition are admixed or may be added to each component separately prior to admixing of the components.

Exemplary thermal polymerization inhibitors include hydroquinone, mono-tert-butyl hydroquinone, benzoquinone, 2,5-diphenyl-p-benzoquinone, pyridine, phenothiazine, p-diaminobenzene, beta-naphthol, naphthylamine, pyrogallol, cuprous chloride and nitrobenzene. These inhibitors are added only for completely preventing polymerization reaction without the actinic radiation set forth above without restraining the photopolymerization reaction. Consequently the amount of the stabilizers may preferably be about 0.005 to 3.0 percent by weight of the total weight of the photopolymerizable composition.

The photopolymerizable compositions of this invention are readily photopolymerized by actinic radiation having wave lengths below 7,000 angstroms, generally between 2,000 and 5,000 angstroms. Practical sources of such actinic radiation include carbon arc lamps, super high pressure mercury lamps, high pressure mercury lamps, low pressure mercury lamps, UV fluorescent lamps, xenon lamps and sunlight.

Furthermore, various compounds such as fillers and plasticizers may be incorporated with the photopolymerizable compositions. These compounds include, for example, polymethylmethacrylates, polystyrenes, polyvinylchlorides, poly(styrene-butadiene) polymers, polybutadienes, natural rubbers, polyvinylbutyrals, soluble polyamides, polyvinylacetates, alkyd resins, saturated polyesters, cellulose acetates, glass fibers, glass cloths, fine powdery silicon oxides and fine powdery calcium carbonate.

The photopolymerizable compositions according to the present invention are useful for manufacturing various image making articles such as letterpress printing plates, gravure printing plates, high-etched offset printing plates, deep-etched printing plates, planography printing plates, name plates, memorial stamps, silk screens and screens for textile printing and process screens and especially useful for producing flexographic printing plates. In addition, these photopolymerizable compositions are useful for producing molds for ceramics and reliefs for displays and indication applications, patterns and braille points. Furthermore, they are preferably used as photopolymerizable plastics such as adhesive interlayers of laminated articles, especially laminated safety glass, coating materials, paints and molding plastics.

In an image making article, when the photopolymerizable composition is exposed to actinic light at a distance of from about 5 cm. to about 100 cm. through, for example, a photographic negative film, the image areas of the compositions are substantially photopolymerized in about 1 to 30 minutes and are thereby rendered insoluble. The non-exposed areas of the compositions may be washed out with water or an aqueous solution. Exemplary aqueous solutions include aqueous solutions of sodium hydroxide, potassium hydroxide, calcium hydroxide, ammonium hydroxide, sodium carbonate, sodium bicarbonate and potassium carbonate; mixture solutions of water with water soluble organic solvents such as methanol, ethanol, isopropanol, acetone, dioxane, tetrahydrofuran and phenol; and aqueous solutions of various kinds of surfactants.

In producing a laminated article, example of suitable adherents for the photopolymerizable compositions of this invention include plastic adherents such as polyamides, polyvinylchlorides, polymethylmethacrylates or polystyrenes, metals or alloys such as aluminum, tin, zinc, magnesium, chromium, Duralumin or stainless steel, ceramics such as glass, asbestos, silica, stones such as marble, and wood. These adherents are positioned and arranged in such a way that all interlayers can be exposed to actinic light.

The present invention is especially effective for the production of laminated safety glass among a variety of laminated articles.

For example, in preparing a laminated safety glass, a spacer of a desired thickness having an inlet for introducing a photopolymerizable composition and an air outlet is inserted between two sheets of glass and the photopolymerizable composition set forth herein is charged through the inlet. One or both sides of the glass sheets are exposed at room temperature for 1 to 30 minutes to a source irradiating actinic radiation at a distance of 5 cm. to 100 cm. By this simple operation the whole area of the interlayer is simultaneously cured without substantially any accompanying strain and the interlayer is completely bonded to the glass sheets by the end of curing (photopolymerization) to give a laminated safety glass. Simply, a laminated safety glass may be produced by placing a spacer of the desired thickness on a sheet of glass, charging a photopolymerizable composition thereto, placing a sheet of glass on the spacer and exposing the resulting assembly to a source irradiating actinic radiation onto one or both sides of the sheets of glass. According to the present invention a variety of laminated articles as well as laminated safety glass may be continuously produced.

This invention will now be illustrated by the following examples in which parts are all by weight unless expressly stated to contrary.

EXAMPLES 1 TO 16

A variety of unsaturated polyesters were prepared by polycondensing the diols and diacids set forth in Table 1 under an atmosphere of nitrogen gas at a temperature of 180° C. to 210° C. for 6 to 8 hours under reduced pressure. 100 parts of the unsaturated polyester were reacted at 100° C. for 2 hours with a specified amount of a variety of diisocyanates shown in Table 1 to produce diisocyanate modified unsaturated polyesters. To 100 parts of the diisocyanate modified unsaturated polyester thus obtained, there were added 30 parts of acrylic acid, 20 parts of methylmethacrylate, 20 parts of styrene, 40 parts of methylacrylate, 2 parts of benzoin and 0.1 part of p-diaminobenzene and these were thoroughly mixed to give a photopolymerizable composition. Each resulting photopolymerizable composition was exposed for 10 minutes to 60 w. fluorescent lamps at a distance of 10 cm. to photopolymerize such and tensile strength, tensile elongation and Young's modulus were measured. The results are shown in Table 1. In Example 4 the diisocyanate modified unsaturated polyester containing in the molecule a segment having a molecular weight of about 80 to 5,000 simultanenously gave a high tensile strength, a high elongation and a low Young's modulus to the photopolymerized article while in Example 2 the one not containing said segment only gave a high Young's modulus to the photopolymerized article but not a high tensile strength.

TABLE 1

| Ex. No. | Diol, mole | Diacid, mole | Ethylenic double bond concentration, mole/gram | Average molecular weight | Diisocyanate, parts [1] | Tensile strength [2] | Tensile elongation [3] | Young's modulus [4] |
|---|---|---|---|---|---|---|---|---|
| 1 | Dioxyethylene glycol, 0.50 | Maleic acid, 0.10; Adipic acid, 0.40 | $1\times10^{-3}$ | 2,200 | | A | A | A |
| 2 | do | Maleic acid, 0.10; Adipic acid, 0.40 | $1\times10^{-3}$ | 2,200 | Methaphenylene diisocyanate, 6. | B | C | A |
| 3 | Polyoxypropylene glycol (average molecular weight: 1,000), 0.50. | Fumaric acid, 0.25; Adipic acid, 0.25 | $5\times10^{-4}$ | 10,000 | | A | A | C |
| 4 | do | Fumaric acid, 0.25; Adipic acid, 0.25 | $5\times10^{-4}$ | 10,000 | Tolylene diisocyanate, 1. | B | D | C |
| 5 | Propylene glycol, 0.30; Polyoxypropylene glycol (average molecular weight: 1,000, 0.20. | Maleic anhydride, 0.10; Sebacic acid, 0.40 | $3\times10^{-4}$ | 7,000 | | B | B | B |
| 6 | Propylene glycol, 0.30; Polyoxypropylene glycol (average molecular weight: 1,000), 0.20. | Maleic anhydride, 0.10; Sebacic acid, 0.40 | $3\times10^{-4}$ | 7,000 | Naphthylene diisocyanate, 3. | C | D | B |
| 7 | Dioxyetheneglycol, 0.10; Polyoxytetramethylene glycol (average molecular weight: 200), 0.40. | Fumaric acid, 0.10; Adipic acid, 0.40 | $7\times10^{-4}$ | 2,500 | | A | B | B |

See footnote at end of table.

TABLE 1—Continued

| Ex. No. | Diol, mole | Diacid, mole | Ethylenic double bond concentration, mole/gram | Average molecular weight | Diisocyanate, parts[1] | Tensile strength[2] | Tensile elongation[3] | Young's modulus[4] |
|---|---|---|---|---|---|---|---|---|
| 8 | Dioxyetheneglycol, 0.10<br>Polyoxytetramethylene glycol (average molecular weight: 200), 0.40. | Fumaric acid, 0.10<br>Adipic acid, 0.40 | $7\times10^{-4}$ | 2,500 | Hexamethylene diisocyanate, 6. | C | C | A |
| 9 | Ethyleneglycol, 0.10<br>Dioxyethylene glycol, 0.40 | Glutaconic acid, 0.05<br>Succinic acid, 0.45 | $6\times10^{-4}$ | 4000, | | B | A | A |
| 10 | Ethyleneglycol, 0.10<br>Dioxyethylene glycol, 0.40 | Glutaconic acid, 0.05<br>Succinic acid, 0.45 | $6\times10^{-4}$ | 4,000 | Tolylene diisocyanate. 3. | C | C | A |
| 11 | Ethyleneglycol, 0.30<br>Alpha, omega-dihydroxy-polybutadiene (average molecular weight: 2,000), 0.20. | Maleic anhydride, 0.10<br>Adipic acid, 0.40 | $2\times10^{-4}$ | 10,000 | | B | C | C |
| 12 | Ethyleneglycol, 0.30<br>Alpha, omega-dihydroxy-polybutadiene (average molecular weight: 2,000), 0.20. | Maleic anhydride, 0.10<br>Adipic acid, 0.40 | $2\times10^{-4}$ | 10,000 | Bitolylenemethane diisocyanate, 2.5. | C | D | C |
| 13 | Tetramethylene glycol, 0.50<br>Polyethylene glycol (average molecular weight, 300), 0.25. | Maleic anhydride, 0.50<br>Succinic acid, 0.45<br>Phthalic anhydride, 0.25 | $3\times10^{-4}$ | 7,000 | | B | B | C |
| 14 | Tetramethylene glycol, 0.50<br>Polyethylene glycol (average molecular weight, 300), 0.25. | Maleic anhydride, 0.05<br>Succinic acid, 0.34<br>Phthalic anhydride, 0.25 | $3\times10^{-4}$ | 7,000 | Tolylene diisocyanate dimer, 1.5. | D | D | C |
| 15 | Dioxyethylene glycol, 0.300<br>Trioxypropylene glycol, 0.195<br>Trimethylolpropane polyoxypropyltriol monoacetate (average molecular weight: 4,000), 0.05. | Fumaric acid, 0.05<br>Adipic acid, 0.45 | $3\times10^{-4}$ | 8,000 | | C | B | C |
| 16 | Dioxyethylene glycol, 0.300<br>Trioxypropylene glycol, 0.195<br>Trimethylolpropane polyoxypropyltriol monoacetate (average molecular weight: 4,000), 0.05. | Fumaric acid, 0.05<br>Adipic acid, 0.45 | $3\times10^{-4}$ | 8,000 | Reaction product of 1 mole of polyoxypropylene glycol (average molecular weight: 200) with 2 moles of tolylene diisocyanate, 6. | D | D | C |

[1] Parts by weight of a diisocyanate per 100 parts by weight of an unsaturated polyester.
[2] Tensile strength: ASTM D638-58T at 20° C.; A=Below 100 kg./cm.$^2$, B=100-200 kg./cm.$^2$, C=200-300 kg./cm.$^2$, D=Above 300 kg./cm.$^2$.
[3] Tensile elongation: ASTM D638-58T at 20° C.; A=Below 200%, B=200-300%, C=300-400%, D=Above 400%.
[4] Young's modulus: A=Above 1000 kg./cm.$^2$, B=1,000-500 kg./cm.$^2$, C=Below 500 kg./cm.$^2$.

Each resulting photopolymerizable composition was exposed for 10 minutes to 60 w. fluorescent lamps at a distance of 10 cm. and tensile strength and elongation of the photopolymerized article were measured. The results are shown in Table 1.

A spacer, 0.75 mm. in thickness, having an inlet for introducing the photopolymerizable composition therethrough and an air outlet was inserted between 2 transparent glass sheets, each 3 mm. in thickness, respectively and the photopolymerizable composition was charged through the inlet. Both sides of the transparent glass sheets were exposed at room temperature for 5 minutes to 60 w. ultraviolet fluorescent lamps set at a distance of 10 cm. from the glass to give a laminated safety glass.

All laminated safety glasses but the ones in Examples 1 and 9, in which the unsaturated polyesters contained segments having a molecular weight from one polar bond to another polar bond below 80 were used, passed the tests according to American Standard Association (hereinafter abbreviated as ASA) Z 26-1-1966, i.e. Light Stability, Luminous Transmittance, Humidity, Boil, Impact (dart from 30 feet and ball from 30 feet), Deviation and Distortion, Abrasion Resistance Tests and Penetration Resistance Test which is to drop a steel sphere weighing 5 pounds from a height of 12 feet. The laminated safety glasses in Examples 1 and 9 did not pass the tests of Impact (dart and ball) and Penetration Resistance. All laminated safety glasses were subjected to the severest test according to ASA Z 26-1-1966, i.e. the Penetration Test which is to drop a steel sphere weighing 5 pounds from a height of 15 feet but only the ones in Examples 4, 6, 8, 10 and 12 passed the test and found to have a high safety.

EXAMPLES 17 TO 24

One mole of diethyladipate and 4 moles of monoethanolamine were reacted at 150° C. for one hour and the resulting product was recrystallized from a mixture solvent of ethanol and benzene to give bishydroxyethyladipamide (abreviated as BHEA). Also one mole of dimethyl terephthalate and 4 moles of ethanolamine were reacted at 150° C. for one hour and the resulting product was recrystallized from a mixture solvent of ethanol and benzene to give bishydroxyethylterephthalamide (abbreviated as BHEP). A variety of unsaturated polyesters were prepared by polycondensing the diols and diacids set forth in Table 2 with BHEA or BHEP. 100 parts of each resulting unsaturated polyester and a specified amount of a variety of diisocyanates shown in Table 2 were reacted at 100° C. for 2 hours to produce diisocyanate modified unsaturated polyesters. To 100 parts of the diisocyanate modified unsaturated polyester thus obtained, there were added 30 parts of acrylic acid, 20 parts of methylmethacrylate, 10 parts of diallylphthalate, 40 parts of butylacrylate, 2 parts of diphenyldisulfide and 0.2 part of hydroquinone and these were thoroughly mixed to give photopolymerizable compositions. Each resulting photopolymerizable composition was exposed for 10 minutes to 60 w. fluorescent lamps at a distance of 10 cm. to photopolymerize such and tensile strength, tensile elongation and Young's modulus were measured. The results are shown in Table 2.

TABLE 2

| Ex. No. | Diol, mole | Amide glycol, mole | Diacid, mole | Ethylenic double bond concentration, mole/gram | Average molecular weight | Diisocyanate, parts by weight | Tensile strength[1] | Tensile elongation[2] | Young's modulus[3] |
|---|---|---|---|---|---|---|---|---|---|
| 17 | Polyoxypropylene glycol (average molecular weight: 1,000), 0.40. | BHEA, 0.10 | Maleic anhydride, 0.10; Glutaric acid, 0.40 | $2\times10^{-4}$ | 6,000 | | A | A | C |
| 18 | do | do | Maleic anhydride, 0.10; Glutaric acid, 0.40 | $2\times10^{-4}$ | 6,000 | Tolylene diisocyanate, 2.0. | B | D | C |
| 19 | Polyoxytetramethylene glycol (average molecular weight: 300), 0.25. | BHEA, 0.25 | Fumaric acid, 0.10; Adipic acid, 0.40 | $5\times10^{-4}$ | 7,000 | | C | A | B |
| 20 | do | do | Fumaric acid, 0.10; Adipic acid, 0.40 | $5\times10^{-4}$ | 7,000 | Hexamethylene diisocyanate, 2.0. | D | D | B |
| 21 | Polyoxyethylene glycol (average molecular weight: 2,000), 0.40. | BHEP, 0.10 | Fumaric acid, 0.10; Sebacic acid, 0.40 | $1\times10^{-4}$ | 9,000 | | B | A | C |
| 22 | Polyoxyethylene glycol (average molecular weight: 2,000), 0.40. | do | Fumaric acid, 0.10; Sebacic acid, 0.40 | $1\times10^{-4}$ | 9,000 | Tolylene diisocyanate dimer, 1.0. | C | D | C |
| 23 | Trimethylolpropane monolaurate, 0.20. Polyoxypropylene glycol (average molecular weight: 300), 0.20. | do | Maleic anhydride, 0.10; Adipic acid, 0.40 | $5\times10^{-4}$ | 7,000 | | B | B | C |
| 24 | Trimethylolpropane monolaurate, 0.20. Polyoxypropylene glycol (average molecular weight: 300), 0.20. | do | Maleic ahhydride, 0.10; Adipic acid, 0.40 | $5\times10^{-4}$ | 7,000 | Omega,omega'-dipropylether diisocyanate, 115. | D | D | C |

[1] Tensile strength=The same as in Example 1 to 16;
[2] Tensile elongation=The same as in Examples 1 to 16;
[3] Young's modulus=The same as in Examples 1 to 16.

To a glass cell consisting of a spacer of 3 mm. in height forming four sides of the cell, a bottom plate of a transparent glass and a top plate of a transparent glass on which a negative of 80 lines per inch for corrugated cardboard was tightly fixed, there was placed the aforesaid photosensitive composition. The negative side of the cell was firstly exposed for 5 minutes and secondly the transparent glass was exposed for 5 minutes to 60 w. fluorescent lamps at a distance of 10 cm. Then the unexposed areas were removed by washing with a 0.3% aqueous sodium hydroxide solution. The printing plates thus obtained from the photopolymerizable compositions of Examples 18, 20, 22 and 24 were fixed on the saddle of a rotary press respectively and the rotary printing was run to give about 50,0000 prints which bore clear and precise images along the whole surface of the corrugated cardboard. On the other hand the ones from the photopolymerizable compositions of Examples 17, 19, 21 and 23 did not withstand this rotary printing.

EXAMPLE 25

Under an atmosphere of nitrogen gas, 0.10 mole of hexamethylene diamine and 0.40 mole of adipic acid were reacted at 210° C. for 3 hours. To the resulting mixture of 0.10 mole of amide dicarboxylic acid and 0.20 mole of adipic acid there were added 0.40 mole of polyoxypropylene glycol having an average molecular weight of 1,000 and 0.10 mole of fumaric acid and the mixture was polycondensed at 200° C. for 5 hours under reduced pressure to produce an unsaturated polyester having an average molecular weight of 6,000 and an ethylenic double bond concentration of $2\times10^{-4}$ mole/gram. 100 parts of the unsaturated polyester thus obtained were reacted at 100° C. for 2 hours with 15 parts of a reaction product between 2 moles of tolylene diisocyanate and 1 mole of polyoxypropylene glycol having an average molecular weight of 1,000. To 100 parts of the diisocyanate modified polyester thus obtained, there were added 20 parts of acrylic acid, 10 parts of N-methylolacrylamide, 5 parts of styrene, 65 parts of methylacrylate, 1.0 part of anthraquinone and 0.1 part of hydroquinone and these were thoroughly mixed to produce a photopolymerizable composition. An assembly composed of, as adherent, one sheet of polymethylmethacrylate having dimensions of 1 m. (length) x 1 m. (width) x 10 mm. (thickness) and one sheet of glass having dimensions of 1 m. (length) x 1 m. (width) x 2 mm. (thickness) and the interlayer of the resulting photopolymerizable composition of 0.5 mm. in thickness was exposed for 10 minutes from the both of the assembly to a 3 kw. three-core carbon arc lamp at a distance of 75 cm. to give a laminated article. This laminated article of polymethylmethacrylate is lighter than that of glass and hardly scratchable and could be used as building material such as undamageable and transparent doors. The temperature of one side of the laminated article thus produced was constantly maintained at 0° C. while that of the other side was reciprocally at 0° C. and 60° C. in a period of 2 hours. This test was continued for 100 hours. The laminated article did not break and the adhesive interlayer did not peel off.

EXAMPLE 26

Under an atmosphere of nitrogen gas, 0.25 mole of polyoxyethylene glycol having an average molecular weight of 200, 0.25 mole of dioxyethylene glycol, 0.10 mole of fumaric acid and 0.40 mole of adipic acid were polycondensed at 180° C. for 6 hours under reduced pressure to produce an unsaturated polyester having an average molecular weight of 4,000 and an ethylenic double bond concentration of $4\times10^{-4}$ mole/gram. 100 parts of the unsaturated polyester thus obtained and 3 parts of tolylene diisocyanate were reacted at 100° C. for 2 hours to produce a diisocyanate modified unsaturated polyester. To 100 parts of the diisocyanate modified unsaturated polyester thus obtained, there were added 40 parts of acrylic acid, 60 parts of methylacrylate, 10 parts of an unsaturated polyester, 4 parts of alpha-methylbenzoin and 0.1 part of tertiary butylcatechol to give a photopolymerizable composition. The above-mentioned unsaturated polyester was prepared by polycondensing 0.25 mole of dioxypropylene glycol, 0.25 mole of dioxyethylene glycol, 0.25 mole of maleic acid and 0.25 mole of phthalic acid in the same manner as described above and had an average molecular weight of 4,000 and an olefinic double bond concentration of $2\times10^{-3}$ mole/gram.

In the same manner as in Examples 1 to 16 a laminated safety glass was produced. This laminated safety glass withstood the test according to ASA Z 26–1–1966, i.e. Impact Ball Test which is to drop a steel sphere weighing 0.5 pound from a height of 30 feet at a temperature of −30° C. to 60° C. Accordingly, this laminated safety glass exhibited no temperature dependency.

EXAMPLES 27 TO 35

0.02 mole of polypropylene glycol having an average molecular weight of 1,000, 0.98 mole of ethylene glycol, 0.10 mole of fumaric acid, 0.35 mole of phthalic acid and 0.55 mole of adipic acid were polycondensed in the same manner as in Example 25 to obtain an unsaturated polyester having an average molecular weight of 6,000 and an olefinic double bond concentration of $5\times10^{-4}$ mole/gram. 100 parts of the unsaturated polyester were reacted at 100° C. for 2 hours with 2.0 parts of tolylene diisocyanate to produce a diisocyanate modified unsaturated polyester. To 100 parts of the diisocyanate modified unsaturated polyester thus obtained, there were added a desired amount of ethylenically unsaturated compounds shown in Table 3, 2 parts of benzoin, 0.1 part of benzoin and 0.1 part of hydroquinone and these were thoroughly mixed to give photopolymerizable compositions. Each resulting photopolymerizable composition was exposed for 10 minutes to 60 w. fluorescent lamps at a distance of 10 cm. to photopolymerize such and tensile strength, tensile elongation and Young's modulus were measured. The results are shown in Table 3.

TABLE 3

| Ex. No. | Ethylenically unsaturated compound (parts by weight) | Tensile strength [1] | Tensile elongation [2] | Young's modulus [3] |
|---|---|---|---|---|
| 27 | Acrylic acid, 100 | D | C | A |
| 28 | Acrylic acid, 60; Styrene, 40 | D | C | A |
| 29 | Acrylic acid, 60; Ethylacrylate, 60 | D | D | D |
| 30 | Acrylic acid, 40; N-methylolacrylamide, 30; Diallylphthalate, 30 | D | C | A |
| 31 [4] | Acrylic acid, 40; N-methylolacrylamide, 30; Diallylphthalate, 30 | C | A | A |
| 32 | Acrylic acid, 20; Methylmethacrylate, 30; 2-ethylhexylacrylate, 50 | D | D | C |
| 33 [4] | Acrylic acid, 20; Methylmethacrylate, 30; 2-ethylhexylacrylate, 50 | B | B | C |
| 34 | Acrylic acid, 20; Cyclohexylmethacrylate, 60; Styrene, 20 | D | D | C |
| 35 | Acrylic acid, 20; Vinylacetate, 10; Butylacrylate, 70; Styrene, 10 | D | D | C |

[1] Tensile strength=The same as in Examples 1 to 16.
[2] Tensile elongation=The same as in Examples 1 to 16.
[3] Young's modulus=The same as in Examples 1 to 16.
[4] In Examples 31 and 33 tolylene diisocyanate was not used.

What is claimed is:

1. A photopolymerizable composition which comprises:

(I) a diisocyanate modified unsaturated polyester prepared by reacting a diisocyanate with an unsaturated polyester at a mole ratio of 1:2 to 1:1, said unsaturated polyester having terminal groups selected from carboxyl and hydroxyl groups, having an average molecular weight of about 2,000 to 50,000, and containing about $2\times10^{-4}$ to $1\times10^{-3}$ mole of ethylenic unsaturation per gram of the unsaturated polyester polymer; the unsaturated polyester polymer containing in the molecule at least one weight percent of a segment, measured from one polar group to the next adjacent polar group, having a molecular weight of about 80 to 5,000 and said polar group representing an ester or amide group;

(II) about 10 to 80 weight percent, based upon the total weight of the composition, of at least two ethylenically unsaturated monomers which are addition-copolymerizable with the diisocyanate modified unsaturated polyester polymer (I), (A) one of said monomers comprising a compound selected from the group consisting of:

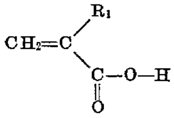
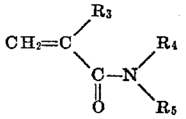

and

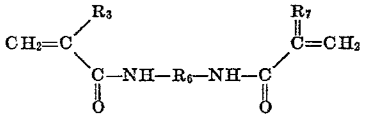

wherein $R_1$ is a member selected from the group consisting of hydrogen, chlorine and methyl, $R_3$ and $R_7$ are each selected from the group consisting of hydrogen and methyl; $R_4$ is one member selected from the group consisting of hydrogen, methyl and ethyl, $R_5$ is a member selected from the group consisting of hydrogen, a $—C_mH_{2m+1}$ group, wherein $m$ is an integer of 1 to 6, a cyclohexyl group, a $—(CH_2)_n—OH$ group, wherein $n$ is an integer of 1 to 5, a $—(CH_2)_p—O—C_qH_{2q+1}$ group, wherein $p$ is an integer of 1 to 5, $q$ is an integer of 1 to 5, and a $—CH_2—CH=CH_2$ group, and wherein $R_6$ is a $—(CH_2)_r—$ group and wherein $r$ is an integer of 1 to 10;

(B) the other of said monomers being present to the extent of 5 to 90% by weight of the monomers and comprising at least one compound selected from the group consisting of:

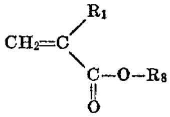

and

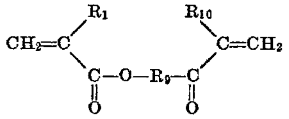

wherein $R_1$ and $R_{10}$ each are a member selected from the group consisting of hydrogen, chlorine and methyl; $R_8$ is a member selected from the group consisting of a $—C_sH_{2s+1}$ group, wherein $s$ is an integer of 1 to 15, a

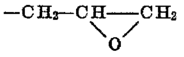

group, a

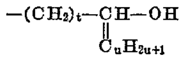

group, wherein $t$ is an integer of 1 to 2 and $u$ is an integer of 1 to 5, a

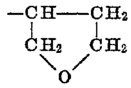

group, a $—CH_2—CH=CH_2$ group and a $$—(CH_2—CH_2—O)_v—H$$

group, wherein $v$ is an integer of 1 to 15; $R_9$ is a $—(CH_2—CH_2—O)_w—$ group, wherein $w$ is an integer of 1 to 15; and (III) about 0.001 to 10 weight percent, based upon the total weight of the composition, of a photopolymerization initiator.

2. A composition as claimed in claim 1 which additionally contains about 0.005 to 3 weight percent of a thermal polymerization inhibitor.

3. A composition as claimed in claim 1 wherein said diisocyanate is selected from the group consisting of 2,4-tolylene diisocyanate, 2,6-tolylene diisocyanate, phenylene diisocyanate, 3,3′-bitolylenemethane - 4,4′ - diisocyanate, methaphenylene diisocyanate, 4,4′-biphenylene diisocyanate, biphenylenemethane diisocyanate, xylene diisocyanates, 1,4-naphthylene diisocyanate, 1,5-naphthylene diisocyanate, 1,4-tetramethylene diisocyanate, 1,6-hexamethylene diisocyanate, 1,10-decamethylene diisocyanate, ω,ω'-diisocyanate dimethylbenzol, ω,ω'-dipropylether diisocyanate, octadecyl diisocyanate, 1,4-cyclohexylene diisocyanate, 4,4' - methylene - bis(cyclohexyl isocyanate), 1,5-tetrahydronaphthylene diisocyanate and tolylenediisocyanate dimers.

4. A composition as claimed in claim 1, wherein said segment of the unsaturated polyester polymer is an alkylene group.

5. A composition as claimed in claim 1, wherein said segment of the unsaturated polyester polymer is an oxyalkylene group.

6. A composition as claimed in claim 1 in which at most one mole, based on two moles of said diisocyanate, of a polyol is employed in modifying said unsaturated polyester with said diisocyanate.

7. A composition as claimed in claim 1 which additionally contains at most 60 weight percent, based upon the weight of said diisocyanate modified unsaturated polyester, of at least one unsaturated polyester.

8. A composition as claimed in claim 1, wherein said (A) compound is acrylic acid.

9. A composition as claimed in claim 1, wherein said (A) compound is acrylamide.

10. A composition as claimed in claim 1, wherein said (B) compound is methylacrylate.

11. A composition as claimed in claim 1, wherein said (B) compound is butylacrylate.

12. A composition as claimed in claim 1, wherein said (C) compound is styrene.

13. A composition as claimed in claim 1, wherein said (C) compound is diallylphthalate.

14. A composition as claimed in claim 1, wherein said ethylenically unsaturated monomer contains at least one compound (C), wherein said compound (C) is present in an amount up to about 80 weight percent based upon the total weight of said ethylenically unsaturated monomer compound.

References Cited

UNITED STATES PATENTS

| | | | |
|---|---|---|---|
| 3,008,917 | 11/1961 | Park et al. | 260—859 |
| 2,879,248 | 3/1959 | Nischk et al. | 260—859 |

OTHER REFERENCES

Tikhomolova et al.: Photosenitized Polymerization of Methyl Methacrylate, Zhur. Prinlad. Khim., 32, pp. 1874–6 (1959).

Abstract 97,322 (Clark), vol. 659, p. 1106, June 24, 1952.

MURRAY TILLMAN, Primary Examiner

R. B. TURER, Assistant Examiner

U.S. Cl. X.R.

96—33, 35.1, 36.3, 115 P; 161—194; 260—3, 4 R, 16, 40 TN, 835, 859 R

UNITED STATES PATENT OFFICE
CERTIFICATE OF CORRECTION

Patent No. 3,677,920 Dated July 18, 1972

Inventor(s) Tsunetoshi Kai et al

It is certified that error appears in the above-identified patent and that said Letters Patent are hereby corrected as shown below:

Col. 1, line 19

"mol" should be -- mole --.

Col. 1, line 64

"uexographic" should be -- flexographic --.

Col. 7, line 41

"other ethylenically unsaturated" should be

-- "compounds (C) include styrene, --.

Col. 7, line 46

"ethyenically" should be -- ethylenically --.

Col. 11, Example 14 in Table 1

"Succinic acid, 0.34" should be -- Succinic acid, 0.45 --.

UNITED STATES PATENT OFFICE
CERTIFICATE OF CORRECTION

Patent No. 3,677,920 Dated July 18, 1972

Inventor(s) Tsunetoshi Kai et al - 2 -

It is certified that error appears in the above-identified patent and that said Letters Patent are hereby corrected as shown below:

Col. 13, Example 24 in Table 2

"ahhydride" should be -- anhydride --.

Col. 13, line 45

"50,0000" should be -- 50,000 --.

Col. 18, line 21

"Abstract 97,322" should be -- Abstract II 97,322 --.

Signed and sealed this 6th day of March 1973.

(SEAL)
Attest:

EDWARD M.FLETCHER,JR.
Attesting Officer

ROBERT GOTTSCHALK
Commissioner of Patents